(12) United States Patent
Katsube et al.

(10) Patent No.: US 8,726,494 B2
(45) Date of Patent: May 20, 2014

(54) HOLDING JIG FOR ELECTRONIC PARTS

(75) Inventors: Akio Katsube, Kanazawa (JP); Hideo Nakagoshi, Omihachiman (JP); Hidemasa Kawai, Yoshida-gun (JP)

(73) Assignee: Murata Manufacturing Co., Ltd., Nagaokakyo-Shi, Kyoto-Fu (JP)

( * ) Notice: Subject to any disclaimer, the term of this patent is extended or adjusted under 35 U.S.C. 154(b) by 8 days.

(21) Appl. No.: 12/574,537

(22) Filed: Oct. 6, 2009

(65) Prior Publication Data

US 2010/0018041 A1 Jan. 28, 2010

Related U.S. Application Data

(62) Division of application No. 09/689,774, filed on Oct. 13, 2000, now Pat. No. 7,624,492.

(30) Foreign Application Priority Data

Oct. 13, 1999 (JP) .................................... 11-291575
Oct. 13, 1999 (JP) .................................... 11-291576

(51) Int. Cl.
*B23P 19/00* (2006.01)

(52) U.S. Cl.
USPC ............................................. 29/760; 29/559

(58) Field of Classification Search
USPC ............ 29/760, 559, 832; 156/73.1; 524/404, 524/430, 437, 439, 511; 174/255, 262, 174/E23.174; 439/67, 70, 71
See application file for complete search history.

(56) References Cited

U.S. PATENT DOCUMENTS

| | | | |
|---|---|---|---|
| 3,255,511 A | 6/1966 | Weissenstern et al. | |
| 3,470,611 A | 10/1969 | McIver et al. | |
| 3,475,213 A | 10/1969 | Stow | |
| 3,561,107 A | 2/1971 | Best et al. | |
| 3,597,081 A | 8/1971 | Cason et al. | |
| 3,733,685 A | 5/1973 | Kauppila | |
| 4,098,945 A | 7/1978 | Oehmke | |
| 4,521,476 A | 6/1985 | Asai et al. | |
| 4,583,042 A | 4/1986 | Riemer | |
| 4,606,962 A | 8/1986 | Reylek et al. | |
| 4,616,413 A | 10/1986 | Iliou et al. | |
| 4,961,804 A | 10/1990 | Aurichio | |
| 5,059,129 A * | 10/1991 | Brodsky et al. | 439/67 |
| 5,277,983 A | 1/1994 | Johnson et al. | |

(Continued)

FOREIGN PATENT DOCUMENTS

| | | |
|---|---|---|
| JP | 62-244142 | 10/1987 |
| JP | 63-160348 | 7/1988 |
| JP | 4-99034 A | 3/1992 |
| JP | 5-74665 | 3/1993 |

(Continued)

OTHER PUBLICATIONS

Office Action dated Mar. 8, 2013 issued in corresponding German Patent Application No. 100 66 482.2, and an English translation thereof.

*Primary Examiner* — Thiem Phan
(74) *Attorney, Agent, or Firm* — Buchanan Ingersoll & Rooney PC

(57) ABSTRACT

An elastic material, in which at least the surface thereof is adhesive and conductive, is provided on a plate, and while a substrate constituting a component of an electronic part is held on the surface of the elastic material by the adhesiveness of the elastic material, an element such as a semiconductor chip is mounted at a fixed location on the substrate.

10 Claims, 6 Drawing Sheets

(56) References Cited

U.S. PATENT DOCUMENTS

| | | | |
|---|---|---|---|
| 5,608,192 A | * | 3/1997 | Moriizumi et al. .......... 174/255 |
| 5,762,744 A | | 6/1998 | Shibata et al. |
| 5,812,570 A | | 9/1998 | Spaeth |
| 6,017,025 A | | 1/2000 | Balz et al. |
| 6,048,919 A | * | 4/2000 | McCullough ................. 524/404 |

FOREIGN PATENT DOCUMENTS

| | | |
|---|---|---|
| JP | 7-22795 | 1/1995 |
| JP | 7-93247 | 10/1995 |
| JP | 7-283599 | 10/1995 |
| JP | 8-186145 A | 7/1996 |
| JP | 11-045912 | 2/1999 |

* cited by examiner

FIG. 4
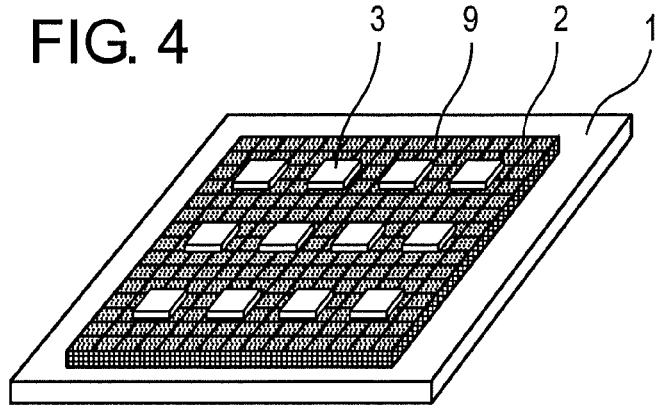
SUBSTRATE MOUNTING PROCESS
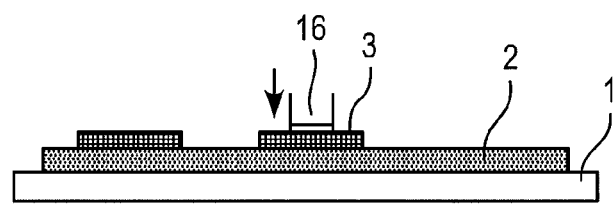
FIG. 5A
DIE BONDING PROCESS
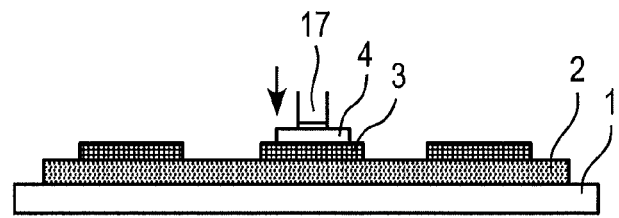
FIG. 5B
WIRE BONDING PROCESS
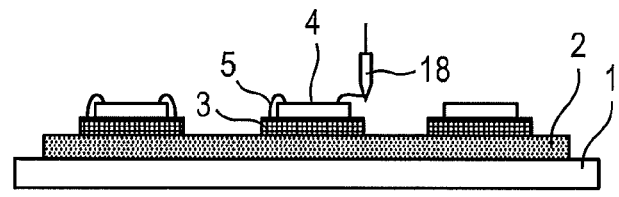
FIG. 5C SUBSTRATE MOUNTING PROCESS
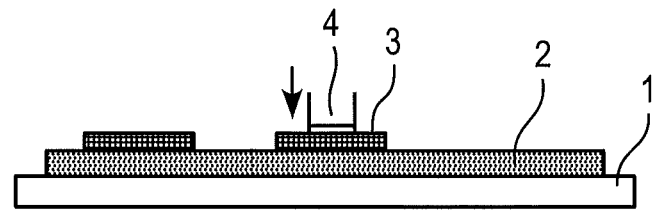
FIG. 6A
BUMP BONDING PROCESS
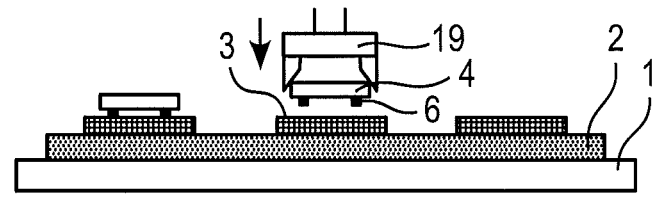
FIG. 6B
Prior Art
FIG. 7
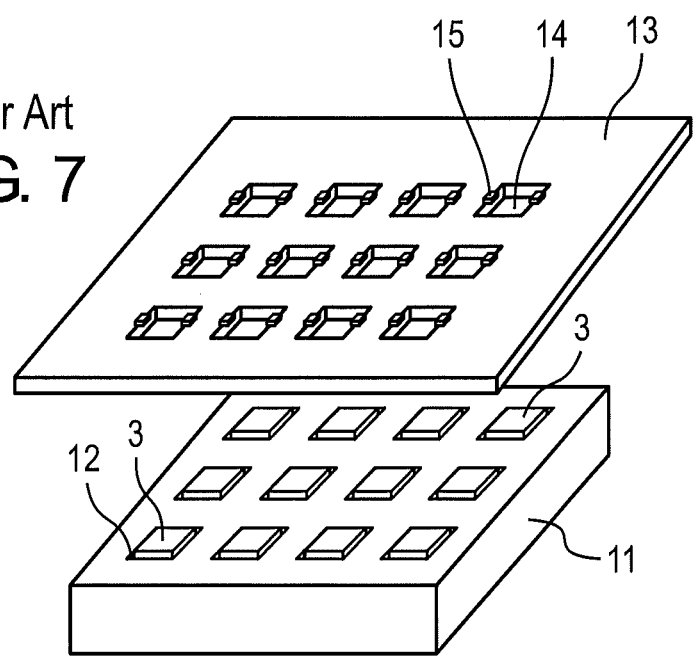

FIG. 8
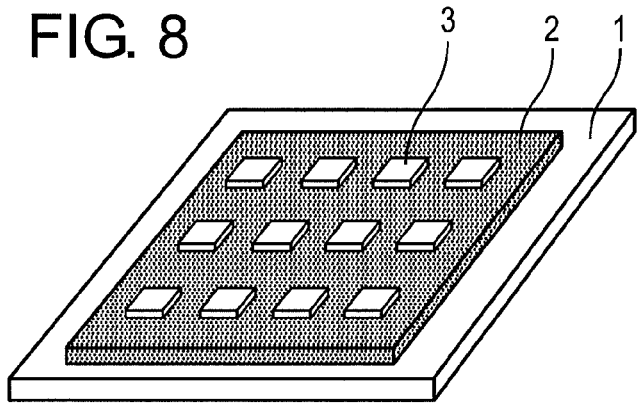
SUBSTRATE MOUNTING PROCESS
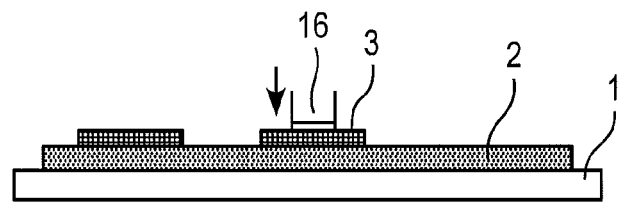
FIG. 9A
DIE BONDING PROCESS
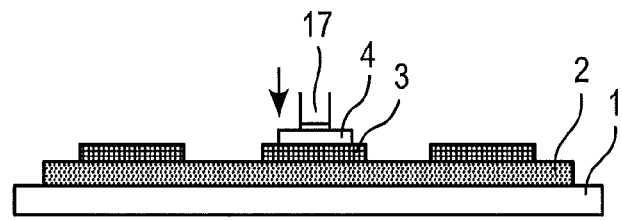
FIG. 9B
WIRE BONDING PROCESS
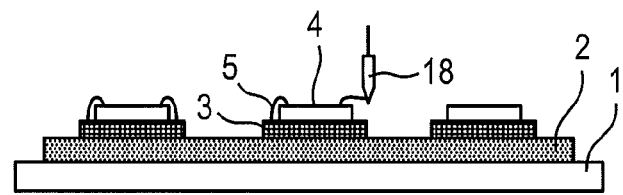
FIG. 9C

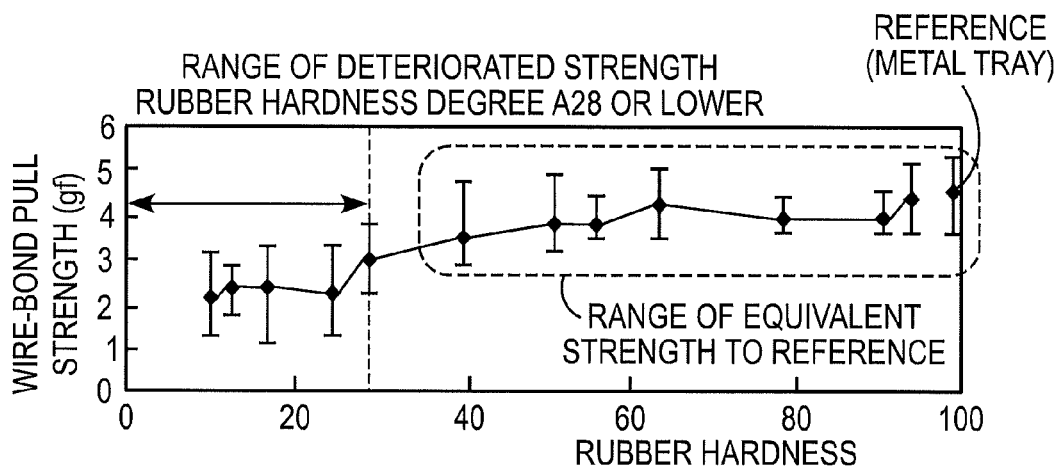
FIG. 10
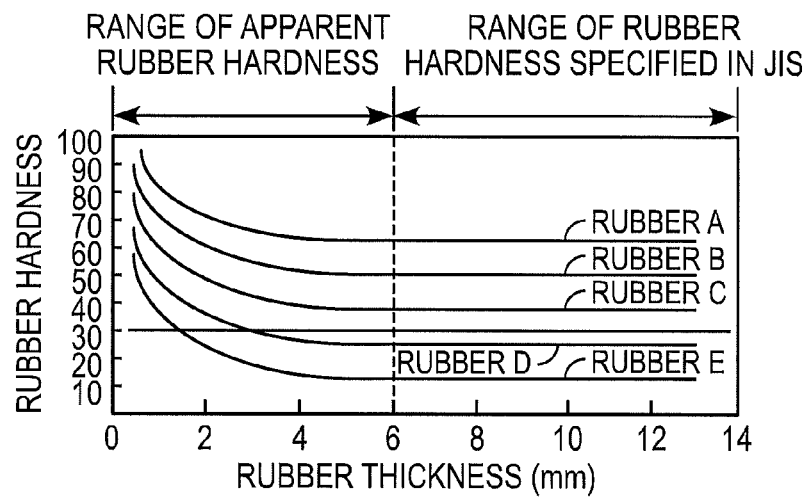
FIG. 11
FIG. 12A  SUBSTRATE MOUNTING PROCESS
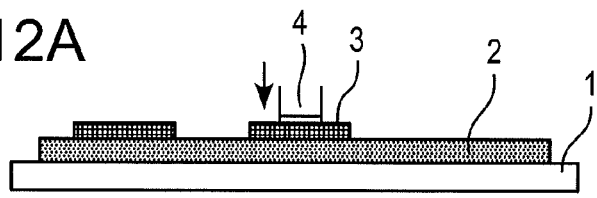
FIG. 12B  BUMP BONDING PROCESS
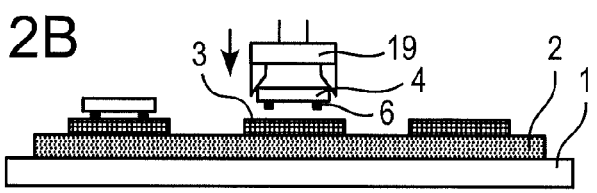

HOLDING JIG FOR ELECTRONIC PARTS

The present application is a divisional application of U.S. patent application Ser. No. 09/689,774, filed on Oct. 13, 2000, which application claims the benefit under 35 U.S.C. §§119 and/or 365 to Japanese Patent Applications Nos. 11-291575 and 11-291576, filed in Japan on Oct. 13, 1999; the entire contents of each of which is hereby incorporated by reference.

FIELD OF THE INVENTION

This invention relates to a holding jig for holding electronic parts such as semiconductor integrated circuits, and the like, when the electronic parts are being manufactured, to a holding method therefor, and to a manufacturing method for the electronic parts.

BACKGROUND OF THE INVENTION

Generally, in handling electronic parts or components constituting electronic parts in manufacturing processes for electronic parts, there are ways to handle a plurality of parts together and ways to handle each part separately. When electronic parts are manufactured in the latter way, up to now, a holding jig for holding electronic parts and components thereof, for example, as shown in FIG. 7, has been used in order to handle each of the parts collectively. In FIG. 7, a metal tray 11 is shown and cavities 12 for arranging a plurality of parts are formed by press molding, or the like, in advance. When semiconductor chips, for example, are wire bonded by using such a holding jig, substrates are arranged in the tray 11, the semiconductor chips are die bonded on each of the substrates, and then the chips are wire bonded. However, in these processes, because the substrates are required to be fixed in the tray 11, the upper surface of the tray 11 was covered by a pressure jig 13, where openings 14 in accordance with the arrangement of the substrates, and a pressure leaf spring 15 for fixing each of the substrates, are formed. When the substrates are disposed inside the concave cavities, clearance is required between the cavity and the substrate in consideration of the ease of inserting and removing substrates and dimensional tolerance limits. Therefore, the position of the substrate inside the cavity may vary, and moreover because the substrate is displaced when it is transferred between processes, the coordinate position of the substrate becomes different inside the cavity, depending on the processes. As a result, when each process is automated, errors in positional recognition are likely to occur, and an additional process for correcting the errors is required.

Furthermore, when the substrate is held down by the pressure leaf spring 15 shown in FIG. 7, an extra space for the pressure leaf spring 15 is required at the substrate. Because of this, it is difficult to make the electronic parts small. In particular, if the pressure leaf spring is made too small, it is difficult to securely hold the substrate, and accordingly the smaller the size of the substrate, the higher the ratio of the space occupied by the pressure leaf spring to the size of the substrate, and therefore miniaturization of the substrate is obstructed.

Furthermore, because the above-mentioned cavity is determined by the size of the substrate and the arrangement pattern of a plurality of substrates, an exclusive tray is required for electronic parts of one kind and is not appropriate for broader use. Therefore, the costs, such as the processing cost, material cost, die cost, and the like, for making the tray is substantially increased.

Accordingly, in Japanese Examined Patent Application Publication No. 7-93247, the applicant of the application concerned, applied for a holding jig for small parts and for a holding method therefor which can solve the various above-mentioned problems.

In the above holding jig, an elastic rubber material, at least the surface of which is adhesive, is used, and small parts are made to be held on the surface to which the parts adhere.

According to such a holding jig and holding method, advantages such as the capability of fixing parts in place, the possibility for broad use and miniaturization, for example, are possible.

However, general characteristics of rubber materials are that the volume resistivity is extremely high and insulation characteristics are exhibited. Accordingly, electrostatic charges are likely to be caused in the insertion and withdrawal, transport, and manufacturing processes of electronic parts or their components. Therefore, the following problems may tend to occur.

1) If such a holding jig and holding method are applied to electronic parts having low electrostatic withstand voltages, there is a risk that the electronic parts will be subjected to electrostatic discharge damage during manufacturing.

2) When small, thin, and light electronic parts or components thereof are handled, holding failure is likely to occur because of electrostatic attraction or repulsion due to the above-mentioned electrostatic charges, and there is a risk that the electronic parts will be damaged and lost and that the holding jig will be damaged.

3) Even when such a holding jig and holding method are applied to electronic parts other than those in 1) and 2), there is a possibility of damaging the electronic parts if electrostatic charges are not eliminated prior to use or during use of the holding jig. Therefore, the necessity of providing exclusive equipment for eliminating the electrostatic charges arises.

SUMMARY OF THE INVENTION

It is an object of the present invention to provide a holding jig for electronic parts, a holding method therefor, and a manufacturing method for the electronic parts, in which, by solving the above-mentioned problems, increases in productivity and reliability of the electronic parts and reduction in manufacturing costs are made possible.

In the present invention, an elastic material, at least a surface of which is adhesive and electrically conductive, is provided. Due to the adhesive strength at the surface of the elastic material, electronic parts or components constituting the electronic parts are held on the surface of the elastic material. Thus, generation of electrostatic charges by the elastic material is prevented, and as electrostatic charges from elsewhere are quickly discharged, the application of high voltage to electronic parts or components thereof or the flow of electric current at electric discharge does not occur.

Furthermore, in the present invention, by adding conductive material to the elastic material, the surface of the elastic material is made conductive. Thus, the entire elastic material is given a predetermined conductivity, and accordingly, electrical conductivity to the elastic material is ensured even for extremely small chip-type parts.

Furthermore, in the present invention, by installing a wiring using electrically conductive material on the surface of the elastic material, the surface of the elastic material is made conductive.

Furthermore, in the present invention, by installing wiring using conductive material inside the elastic material, which is exposed on the surface of the elastic material, the surface of the elastic material is made conductive. Thus, the electrical conductivity of the elastic material is further increased and the shortening of the current path is targeted.

Furthermore, in the present invention, while a substrate is held on the surface of a holding jig having an elastic material, at least the surface of which exhibits adhesive properties and electrical conductivity, due to the adhesive strength of the surface, an element may be mounted on and electrically connected to the substrate. Thus, the element is mounted on the substrate without subjecting the element to electrostatic discharge damage.

In the present invention, a holding jig having an elastic material, at least the surface of which exhibits adhesive properties, is used, and while a substrate is held on the surface of the elastic material by the adhesive strength of the surface, an element is mounted on and electrically connected to the substrate.

Furthermore, in the present invention, in the mounting process, ultrasonic waves are applied to the connecting portion where electrical connection is performed. Thus, even small electronic parts maintain a fixed bonding strength.

Furthermore, in the present invention, the hardness of the elastic material is a rubber hardness degree of A30 or more. Thus, the displacement of a substrate being held by adhesion is suppressed, and furthermore, the absorption of ultrasonic wave energy is suppressed.

Furthermore, in the present invention, the holding jig contains heat-resistant material having a heat-resistance temperature of 250° C. Thus, an element can be mounted on a substrate by wire bonding or bump bonding by heating while using the holding jig. Accordingly, the time required for bonding is reduced and the bonding strength is increased.

Furthermore, in the present invention, the holding jig is a laminated structure made of a hard plate and an elastic material. Thus, the flatness of the surface of the elastic material is increased.

Furthermore, in the present invention, the primary material of the elastic material is silicone resin. Thus, the deterioration of the elastic material with the passage of time is prevented and stability is increased.

Furthermore, in the present invention, in a wire bonding process, an element is electrically connected to the surface. Thus, the element, on the upper surface of which a pad is contained, is electrically connected to an electrode on the substrate.

Furthermore, in the present invention, in a bump bonding process, an element is electrically connected to the substrate. Thus, an element, on the lower surface of which an electrode for connection is contained, is electrically connected to an electrode on the substrate through the bump.

BRIEF DESCRIPTION OF THE DRAWINGS

FIG. 4 is a perspective view showing a holding method for electronic parts;

FIGS. 5A, 5B, and 5C are sectional views showing steps in each process in a manufacturing method for electronic parts;

FIGS. 6A and 6B are sectional views showing steps in each process in another manufacturing method for electronic parts;

FIG. 7 is a perspective view showing the state of a holding jig used in a conventional manufacturing method for electronic parts;

FIG. 8 is a perspective view showing the structure of a holding jig to be used in a manufacturing method for electronic parts according to a fourth embodiment;

FIGS. 9A, 9B, and 9C are sectional views showing steps in each process in the manufacturing method for electronic parts shown in FIG. 8;

FIG. 10 shows the relationship between the rubber hardness of elastic materials and the bonding strength of wire bonding;

FIG. 11 shows the relationship between the thickness of elastic materials and the rubber hardness; and FIGS. 12A and 12B are sectional views showing steps in each process in a manufacturing method for electronic parts according to a fifth embodiment.

DESCRIPTION OF THE PREFERRED EMBODIMENTS

A holding jig for an electronic part according to a first embodiment is described with reference to FIGS. 1A and 1B.

Figure 1A:
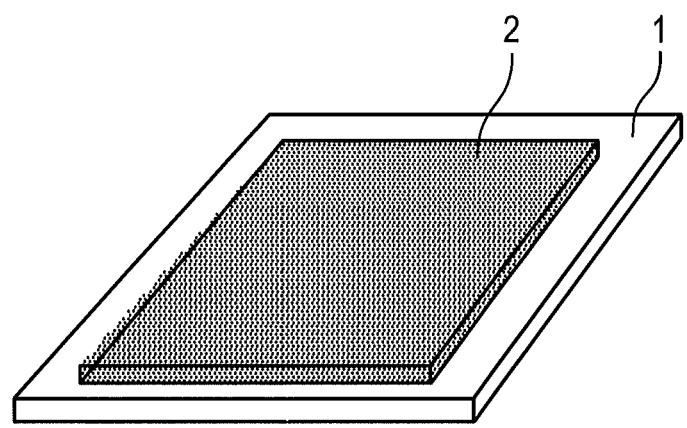
FIGS. 1A and 1B are a perspective view and a sectional view showing the structure of a holding jig to be used in a manufacturing method for electronic parts according to a first embodiment.
Figure 1B:
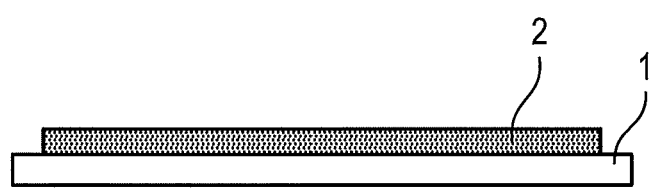

FIGS. 1A and 1B are a perspective view and a sectional view of a holding jig for holding an electronic part or component thereof to be manufactured. In FIGS. 1A and 1B, a hard plate 1 made of metal and an elastic material 2 laminated on the surface of the hard plate 1 are shown. It is desirable that the hardness of the elastic material 2 be a rubber hardness degree of A30 or more according to a type A durometer hardness test specified in Japanese Industrial Standard JIS K 6253, Hardness testing methods for vulcanized rubber. Moreover, the elastic material 2 is influenced by the plate 1 as a foundation, depending on the thickness of the elastic material 2, but the rubber hardness is set to substantially be a rubber hardness degree of A30 or more. For example, high-temperature resistant rubber containing silicone resin as a major constituent of the rubber is used.

In FIGS. 1A and 1B, the elastic material 2 is made conductive overall by adding conductive particles such as carbon powder to the silicone resin as a major constituent and by dispersing the powder.

When a rubber material having a low elastic modulus is used for the elastic material 2, the rebound elasticity is lowered and at the same time a viscoelasticity is increased. This viscoelasticity makes a substrate 3 adhere to the surface of the elastic material. For example, soft silicone rubber shows an adhesive strength in the range of 1 to 10 g/mm$^2$. As the adhesive strength is dependent on the particle size and dispersed density of the above-mentioned conductive powder, the manufacturing conditions of the elastic material are set so that the adhesive strength and the electric conductivity are in a fixed range, respectively.

Because the elastic material has been made conductive in this way, an electronic part and a component thereof being held on the surface of the elastic material are not subjected to electrostatic discharge damage, or adsorption or repulsion because of electrostatic charge, and the process and equipment for removing electrostatic charges becomes unnecessary.

Next, the structure of a holding jig according to a second embodiment is described with reference to FIGS. 2A and 2B.

Figure 2A:
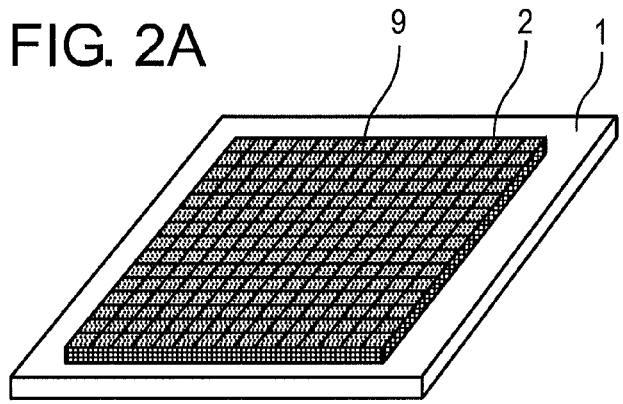
FIGS. 2A and 2B are a perspective view and a sectional view showing the structure of a holding jig to be used in a manufacturing method for electronic parts according to a second embodiment.
Figure 2B:
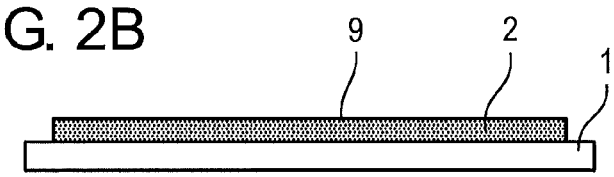

In FIGS. 2A and 2B, a hard plate 1 made of metal and an elastic material 2 laminated on the surface of the hard plate 1 are shown. On the surface of this elastic material 2, a pattern using a conductive film 9 is formed and the end portion of the pattern is made conductive to the plate 1. This conductive film 9 is patterned so that while a plurality of electronic parts or components thereof are held on the surface of the elastic material 1, each of the electronic parts or components, which is in contact with part of the conductive film, becomes electrically conductive. In this example, a lattice pattern is made to have a narrower pitch in length and width than the width of the parts. Such a pattern is not limited to the lattice pattern and may be freely combined with, for example, a concentric pattern and a radiating pattern. However, a pattern, in which a plurality of conductive paths from the circumference (end surface) of the elastic material 2 to the outside such as the plate 1 are arranged to reduce the surface resistance, and in which even if part of the wiring is disconnected, electrical conduction is secured by another path, is desirable.

The above-mentioned conductive film is formed by a method of printing a resin material with conductive materials added thereto (conductive paste), a method of making a film by plating, a method of making a film by dry processing such as vacuum evaporation and sputtering, a method of attaching a metal wire and metal foil, or the like.

Next, the structure of a holding jig according to a third embodiment is described with reference to FIGS. 3A and 3B.

Figure 3A:
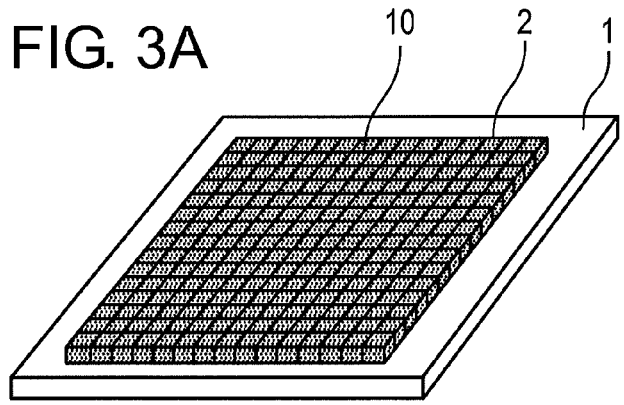
FIGS. 3A and 3B are a perspective view and a sectional view showing the structure of a holding jig to be used in a manufacturing method for electronic parts according to a third embodiment.
Figure 3B:
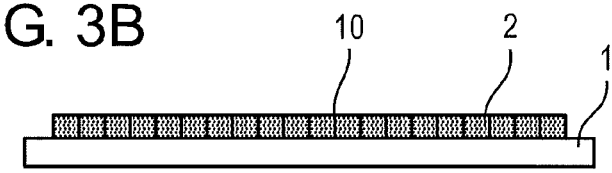

In FIGS. 3A and 3B, a hard plate 1 made of metal and an elastic material 2 laminated on the surface of the hard plate 1 are shown. In this example, a wiring using a conductive material 10 is installed inside the elastic material 2, the upper portion of the conductive material 10 is exposed over the surface of the elastic material 2, and the lower portion is made conductive to the plate 1. The wiring using the conductive material 10 is arranged by a method of molding the conductive material 10 at the same time the elastic material 2 is molded, a method of embedding the conductive material 10 after the elastic material 2 has been molded, or the like.

Next, a method of holding electronic parts and a manufacturing method of electronic parts are described with reference to FIGS. 4, 5A, 5B, 5C, 6A and 6B.

FIG. 4 is a perspective view showing the structure of a holding jig for holding substrates, and FIGS. 5A to 5C show a manufacturing process for an electronic part in which an element is mounted on a substrate by die bonding and wire bonding.

In FIG. 4, a hard plate 1 of metal and an elastic material 2 laminated on the surface of the plate 1 are shown. The elastic material 2 is conductive, in a similar manner to the structure shown in the second embodiment. As described hereinafter, in a substrate mounting process, a plurality of substrates, each constituting a component of an electronic part, are arranged on the surface of the elastic material 2. The substrate 3 may include, for example, any of a resin substrate of a glass epoxy group, a ceramic substrate of alumina, and the like, or a laminate thereof can be used. Furthermore, any electronic part such as a passive component, for example, may be loaded at a fixed location of the substrate 3 in advance.

As shown in FIG. 5A, in a substrate mounting process, a plurality of substrates 3 are arranged at fixed locations on the surface of an elastic material 2 by using a mounter. This mounter is a general-purpose machine which functions to chuck a work piece, such as a substrate, at a fixed location, move it, rotate it as required, and place it at a fixed location. In the drawing, a nozzle 16 for vacuum chucking is shown. That is, the mounter repeats an operation for removing a substrate one by one from a cartridge containing a plurality of substrates by vacuum chucking and for placing the substrate at a fixed location on the elastic material 2. In this way, as shown in FIG. 4, a plurality substrates 3 are arranged on the surface of the elastic material 2. As the surface of the elastic material 2 is adhesive, a plurality of substrates can be arranged and fixed only when the mounter places the substrates in order on the surface of the elastic material 2.

In a subsequent die bonding process, as shown in FIG. 5B, an element 4 such as a semiconductor chip is die bonded on the substrate 3. In the drawing, a nozzle 17 of the mounter for picking up the element 4 from a fixed location and for placing the element 4 on the substrate is shown. In this die bonding process, a heating process for hardening an adhesive, to glue the element 4 at a fixed location on the substrate 3 is included.

In the subsequent wire bonding process, as shown in FIG. 5C, a bonding pad exposed on the surface of the element 4 and an electrode formed on the substrate 3 are connected by a bonding wire 5. In the drawing, a capillary 18 of the wire bonder is shown.

The element 4 represents, for example, a semiconductor element, piezoelectric element, dielectric element, glass element, and may represent any element to be mounted on the substrate and be electrically connected.

Furthermore, various methods for wire bonding such as, for example, a method of ball bonding, a method of wedge bonding, and the like, can be applied. In these wire bonding processes, a process for applying ultrasonic waves to the bonding portion of the wire is included.

FIGS. 6A and 6B show the sequence of a manufacturing method for an electronic part where an element is mounted on a substrate by bump bonding.

First, in a substrate mounting process, as shown in FIG. 6A, a plurality of substrates 3 are disposed at fixed locations on the surface of an elastic material 2 by using a mounter. In the drawing, a nozzle 4 for vacuum chucking of the mounter is shown.

Next, as shown in FIG. 6B, an element 4 provided with a bump 6 in advance is joined at a fixed location on the substrate 3 by a bump bond. That is, flip chip bonding is performed. In the drawing, a collet 19 for positioning the element and for applying ultrasonic waves is shown.

As a bump electrode, any of a gold (Au) bump, a solder bump, a resin bump, for example, can be used.

The above-mentioned manufacturing processing can also be applied to a process where bumps are fitted to semiconductor chips, a mounting process where caps are glued on electronic parts, and the like, except die bonding and wire bonding processes. Furthermore, the manufacturing processing can be applied to a characteristics measurement process for semi-finished and finished products, an adjustment process for trimming, and various processes such as a simple storing process, transferring process, and the like.

As described above, because a substrate 3 is made to be held by the adhesiveness of the surface of an elastic material 2, the positional variation and the movement between processes of the substrate 3 are prevented, and in particular by utilizing a mounter in the substrate mounting process, the alignment (stability of the pitch, rotational position, for example) of the substrate 3 is improved and recognition errors are suppressed in automation of each process. Furthermore, because the elastic material 2 is conductive, the elastic material 2 and the substrate 3 are prevented from being charged because of electrostatic charges, and the discharge current caused by the static electricity is prevented from flowing through the element mounted on the substrate.

Furthermore, because a space for weighting the substrate 3 with a pressure leaf spring is not required, miniaturization of electronic parts is facilitated.

Furthermore, even if the size and arrangement pattern of the substrate 3 are different, because a common holding jig can be used, manufacturing costs can be reduced.

Moreover, in the embodiments, the hard plate 1 was disposed on the lower surface of the elastic material 2, but provision of this plate is not necessarily required.

A manufacturing method of electronic parts according to a fourth embodiment is described with reference to FIGS. 8 to 11.

FIG. 8 is a perspective view showing the structure of a holding jig for holding substrates. In FIG. 8, a hard plate 1 made of metal and an elastic material 2 laminated on the upper surface of the plate 1 are shown. It is desirable that the hardness of the elastic material 2 be a rubber hardness degree of A30 or more according to a type A durometer hardness test specified in Japanese Industrial Standard JIS K 6253, Hardness testing methods for vulcanized rubber. Moreover, as described later, the elastic material 2 is influenced by the plate 1 as a foundation, depending on the thickness of the elastic material 2, but the rubber hardness is set to substantially be a rubber hardness degree of A30 or more.

Specifically, rubber containing silicone resin as its major constituent and having a heat-resistance temperature of 250° C. is used.

In FIG. 8, substrates 3, each constituting a component of an electronic part, are shown as being disposed on the elastic material 2. When a rubber material 1 having a low elasticity, such as silicone rubber is used, the repulsive force is lowered, and at the same time, viscoelasticity is increased. Because of this viscoelasticity, the substrates 3 are made to adhere to the surface of the elastic material. For example, in the case of soft silicone rubber, an adhesive strength in the range of 1 to 10 g/mm$^2$ is shown. The disposition of the substrates 3 on the elastic material 2 may be made by hand, but it is desirable to make the arrangement by using a mounter in order to shorten the processing time when the location and direction of the substrate are automatically derived through image processing, for example, and to reduce the number of manual processes.

The substrates 3 may include, for example, any of a resin substrate of a glass epoxy group, a ceramic substrate of alumina, or a laminate thereof can be used. Furthermore, any electronic part such as a passive component, for example, may be loaded at a fixed location of the substrate 3 in advance.

Thus, because an elastic material is laminated on the upper surface of a hard flat plate 1, the flatness of the surface of the elastic material is increased and the positional accuracy of a substrate to be disposed on the elastic material and the positional accuracy of the element to be mounted on the substrate are not degraded.

FIGS. 9A, 9B, and 9C show the manufacturing procedure of an electronic part in which an element is mounted on a substrate by die bonding and wire bonding.

First, in a substrate mounting process, as shown in FIG. 9A, a plurality of substrates 3 are arranged at fixed locations on the surface of an elastic material 2 by using a mounter. This mounter is a general-purpose machine which functions to chuck a work piece such as a substrate at a fixed location, move it, rotate it as required, and place it at a fixed location. In the drawing, a nozzle 16 for vacuum chucking is shown. That is, the mounter repeats an operation for removing a substrate one by one from a cartridge containing a plurality of substrates by vacuum chucking and for placing the substrate at a fixed location on the elastic material 2. In this way, as shown in FIG. 8, a plurality of substrates 3 are arranged on the surface of the elastic material 2. As the surface of the elastic material 2 is adhesive, a plurality of substrates can be arranged and fixed only when the mounter places the substrates in order on the surface of the elastic material 2.

Moreover, because the rubber hardness of the elastic material is a rubber hardness degree of A30 or more, the substrate is hardly displaced on the elastic material in the direction of the substrate of the elastic material or in the vertical direction to the surface, and high positional accuracy of the substrate is maintained.

In the following die bonding process, as shown in FIG. 9B, an element 4, such as a semiconductor chip, is die bonded on the substrate 3. In the drawing, a nozzle 17 of the mounter for picking up the element 4 from a fixed location and for placing the element 4 on the substrate is shown. In this die bonding process, a heating process for hardening an adhesive to glue the element 4 at a fixed location on the substrate 3 is included. For this purpose, a heat-resistant material having a heat-resistance temperature of 250° C. is used so that the heat-resistance temperature of the elastic material 2 becomes higher than a heating temperature of 100 to 200° C. in the die bonding process.

In a subsequent wire bonding process, as shown in FIG. 9C, a bonding pad exposed on the surface of the element 4 and an electrode formed on the substrate 3 are connected by a bonding wire 5. In the drawing, a capillary 18 of the wire bonder is shown. In this wire bonding process, the heating temperature is also in the range of 100 to 200° C. and the heat-resistance temperature of the elastic material 2 is higher than this temperature.

The element 4 represents, for example, a semiconductor element, piezoelectric element, dielectric element, glass element, and represents any element if the element is attached on the substrate and is electrically connected.

Furthermore, various methods for wire bonding such as, for example, a method of ball bonding, a method of wedge bonding, can be applied. In these wire bonding processes, a process for applying ultrasonic waves to the bonding portion of the wire is included.

FIG. 10 shows the relationship between rubber hardness and bonding strength of wire. As measurement conditions, a common wire bonding method where ultrasonic waves are applied was used for wire bonding, and regarding a plurality of samples where the elastic materials have a plurality of levels of rubber hardness, their wire-bond pull strength (strength measured by a wire-bond pull test) was measured. Furthermore, when wire bonding was performed using a conventional tray made of metal, but without using the elastic material 2 and the plate 1, the wire-bond pull strength was measured and is shown as a reference value.

Based on the result shown in FIG. 10, when the rubber hardness of the elastic material is a rubber hardness degree of A28 or less, the bond strength of the wire deteriorates, but it is understood that when the rubber hardness is a rubber hardness degree of A30 or more, a strength equivalent to the reference value can be obtained. Therefore, it is desirable to make the rubber hardness of a rubber hardness degree of A30 or more.

FIG. 11 shows the relationship between the rubber thickness and the rubber hardness of the above-mentioned elastic materials. The rubber hardness according to Japanese Industrial Standard JIS K 6253 is constant when the rubber thickness is 6 mm or more. When the rubber thickness is less than 6 mm, the rubber hardness is affected by the foundation, and as the rubber thickness decreases, the rubber hardness tends to substantially increase. Here, the hardness of the elastic material itself is not important, but the rubber hardness becomes important. Therefore, in the examples shown in FIG. 11, when an elastic material having a rubber thickness of 6 mm or more is used, rubber A, B, and C are used. However, when an elastic material having a rubber thickness of less than 3 mm is used, rubber D may also be used. In the same way, when the rubber thickness is less than 1.8 mm, rubber E may also be used.

As described above, because a substrate 3 is made to be held by the adhesiveness of the surface of an elastic material 2, positional variation and movement between processes of the substrate 3 are prevented, and in particular, by utilizing a mounter in a substrate mounting process, the alignment (stability of the pitch, rotational position, for example) of the substrate 3 is improved and recognition errors are suppressed in automation in each process.

Furthermore, because the space for weighting a substrate 3 with a pressure leaf spring is not required and the wasteful space is removed, miniaturization of electronic parts is facilitated.

Furthermore, even if the size and arrangement pattern of substrates are different, because a common holding jig can be used, manufacturing costs can be reduced.

Furthermore, because the rubber hardness of an elastic material is made to be a rubber hardness degree of A30 or more, the bonding energy produced by ultrasonic waves in wire bonding is hardly absorbed by the elastic material, and accordingly a bonding strength equivalent to that in the case in which a conventional metal tray is used can be obtained. Furthermore, when the primary material of an elastic material 2 is silicone resin and a holding jig is heat-resistant, it may be fitted for the heating process in an existing die bonding process and wire bonding process.

Next, a manufacturing method for electronic parts according to a fifth embodiment is described with reference to FIG. 12. FIG. 12 shows the procedure of a manufacturing method for electronic parts in which an element is mounted on a substrate by a bump bond.

First, in a substrate mounting process, as shown in FIG. 12A, a plurality of substrates 3 are arranged at fixed locations on the surface of an elastic material by using a mounter. In the drawing, a nozzle 4 for vacuum chucking of the mounter is shown.

Next, as shown in FIG. 12B, an element 4 provided with a bump 6 in advance is joined at a fixed location on the substrate 3 by a bump bond. That is, flip chip bonding is performed. In the drawing, a collet 19 for positioning the element 4 and for applying ultrasonic waves is shown. In this bump bond process, the substrate 3 is heated to 100 to 200° C. At this time, because the heat-resistance temperature of the elastic material 2 is 250° C., the elastic material does not deteriorate.

As a bump electrode, any of a gold (Au) bump, a solder bump and a resin bump, for example, can be used.

Regarding the bonding energy produced by the ultrasonic waves, the absorption of the bonding energy is suppressed by making the rubber hardness of the elastic material 2 a rubber hardness degree of 30 or more, and in the same way as in the wire bonding shown in FIG. 11, a bonding strength equal to that in the case where a conventional metal tray is used can be obtained.

Moreover, in the embodiments, a hard plate 1 is disposed on the lower surface of the elastic material 2, but this plate is not necessarily required.

Although this invention has been illustrated and described in accordance with certain preferred embodiments, it is recognized that the scope of this invention is to be determined by the following claims. All of the aforementioned documents are each incorporated by reference herein in each of their entireties.

What is claimed is:

1. An apparatus for manufacturing an electronic part or component constituting the electronic part, comprising:
   a holding jig including,
   a metal plate; and
   an electronic part holding layer including an elastic material laminated on the plate wherein the elastic material includes conductive material and at least a surface of the holding layer is adhesive and electrically conductive and the surface of the holding layer consists of the elastic material and the conductive material, and wherein a plurality of electronic parts or components constituting the electronic part are holdable by a viscoelastic adhesive strength of the elastic material and removable therefrom.

2. The apparatus according to claim 1, wherein the elastic material is made electrically conductive by installing a wiring using conductive material on the surface of the elastic material.

3. The apparatus according to claim 1, wherein the elastic material is made to be electrically conductive by installing a wiring using electrically conductive material inside the elastic material, the wiring being exposed on the surface of the elastic material.

4. The apparatus according to claim 1, wherein the elastic material has a rubber hardness degree of at least A30.

5. The apparatus according to claim 1, wherein the electrically conductive material is a carbon powder.

6. The apparatus according to claim 1, wherein the elastic material has a heat resistance of at least 250° C.

7. The apparatus according to claim 1, wherein the elastic material is a silicon resin.

8. The apparatus according to claim 1, wherein an electrically conductive film is formed on the surface of the elastic material.

9. The apparatus according to claim 8, wherein the electrically conductive film is formed in a lattice pattern.

10. The apparatus according to claim 1, wherein the elastic material has an adhesive strength of 1-10 g/mm$^2$.

* * * * *